United States Patent [19]

Rosztoczy et al.

[11] 3,770,518

[45] Nov. 6, 1973

[54] METHOD OF MAKING GALLIUM ARSENIDE SEMICONDUCTIVE DEVICES

[75] Inventors: Ferenc E. Rosztoczy, Santa Clara; Celestin J. Casau, San Mateo County; Joshyo Kinoshita, Santa Clara County, all of Calif.

[73] Assignee: Varian Associates, Palo Alto, Calif.

[22] Filed: Jan. 28, 1971

[21] Appl. No.: 110,571

[52] U.S. Cl. .................. 148/171, 148/172, 117/201, 117/215, 252/62.3 GA, 118/415, 317/235 R, 148/33.5

[51] Int. Cl. .............................................. H01l 7/38

[58] Field of Search .................... 148/171, 172, 173, 148/33.5, 175; 117/201, 215; 252/62.3 GA; 317/234 UA, 235 NA

[56] References Cited

UNITED STATES PATENTS

| | | | |
|---|---|---|---|
| 3,565,702 | 2/1971 | Nelson | 148/172 |
| 3,551,219 | 12/1970 | Panish et al. | 148/171 |
| 3,607,463 | 9/1971 | Kinoshita et al. | 148/171 |

OTHER PUBLICATIONS

Rosztoczy et al., "Germanium–Doped Gallium Arsenide", Journal of Applied Physics, Vol. 41, No. 1, Jan. 1970, pp. 264–270. QC1.J82.

Panish et al., "Double–Heterostructure Injection Lasers with Room–Temperature As Low As 2,300 A/cm²," Applied Physics Letters, Vol. 16, Apr. 15, 1970 pp. 326 and 327. QC1.A745.

Kressel et al., "Luminescence due to Ge Acceptors in GaAs," Journal of Applied Physics, Vol. 39, No. 9, Aug. 1968, pp. 4059–4066. QC1.J82.

Moriizumi et al., "Si– and Ge–Doped GaAs p–n Junctions," Japanese Journal of Applied Physics, Vol. 8, Mar. 1969, pp. 348–357. QC1.J25.

*Primary Examiner*—G. T. Ozaki
*Attorney*—Stanley Z. Cole and Leon F. Herbert

[57] ABSTRACT

Germanium is disclosed as a p-type dopant useful in gallium arsenide semiconductive devices such as varactors, IMPATT diodes, photocathodes, and the like. p-n junction gallium arsenide devices are fabricated by successively sliding a germanium doped melt of gallium arsenide in gallium and an n-doped melt of gallium arsenide in gallium over a gallium arsenide seed crystal for growing successive epitaxial p and n or n and p layers on the substrate while exposing the substrate to only one thermal cycle, whereby improved p-n junction devices are obtained.

3 Claims, 9 Drawing Figures

INVENTORS
FERENC E. ROSZTOCZY
CELESTIN J. CASAU
JOSHYO KINOSHITA
BY Leon F. Herbert
ATTORNEY

INVENTORS
FERENC E. ROSZTOCZY
CELESTIN J. CASAU
JOSHYO KINOSHITA

BY Leon F. Herbert
ATTORNEY

METHOD OF MAKING GALLIUM ARSENIDE SEMICONDUCTIVE DEVICES

DESCRIPTION OF THE PRIOR ART

Heretofore, germanium doped gallium arsenide epitaxial layers have been grown on a semi-insulating substrate. Such germanium doped gallium arsenide layers have been tested for their electrical resistivity and photoluminescence. It was found that the germanium doped gallium arsenide is always p-type when grown at 900°–875° C from a saturated solution of gallium arsenide in gallium and containing 56 atomic percent or less germanium as a p-type dopant. This experiment is reported in the Journal of Applied Physics of Vol. 41, No. 1, pages 264–270 of January 1970.

The germanium doped gallium arsenide layers were grown by the tipping method as described in the aforecited article wherein the substrate is mounted in the bottom of a boat tipped such that the melt runs to one end of the boat away from the substrate. The boat and melt are heated to growth temperature and then the boat is tipped such that the melt covers the substrate for epitaxial growth as the boat is allowed to cool. When the growth is completed the boat is tipped again and a quartz weight in a graphite slider slides across the substrate scraping off the excess melt and pushing the melt to the corner of the boat away from the substrate.

While the results of the aforecited article were of scientific interest there was no teaching nor suggestion therein of an application of such material to the construction of useful semi-conductive devices.

SUMMARY OF THE PRESENT INVENTION

In the present invention it has been discovered that germanium as a p-type dopant in gallium arsenide is much superior to zinc as a p-type dopant in gallium arsenide since germanium has a vapor pressure at 700° C of approximately $7\times10^{-11}$torr, whereas zinc at this temperature has a vapor pressure of approximately 60 torr. Thus, the doping levels utilizing germanium are more readily controlled and unwanted diffusion of germanium is more easily controlled. In particular, due to the extremely low vapor pressure of germanium, melts of germanium doped gallium arsenide dissolved in gallium and melts of a similar material doped with a suitable n-type dopant, such as tin, selenium or tellurium may be exposed in a common gaseous atmosphere without contamination of the n-type melt from the germanium doped melt. As a consequence, using a sliding bin method for epitaxial growth of p and n layers, p-n junctions may be grown with extremely precisely controlled boundaries and carrier concentrations. Sliding bin methods for growing p-n junctions are disclosed and claimed in co-pending U.S. application Ser. No. 110,570, filed Jan. 25, 1971 and assigned to the same assignee as the present invention.

The principal object of the present invention is the provision of improved gallium arsenide semiconductive devices and methods of making same.

In one feature of the present invention, a semiconductive device includes a gallium arsenide crystal having first and second interfacing subregions of different electrical characteristics, one of such subregions being of a p-type material doped with germanium to a concentration substantially determinative of the p-type conductivity.

In another feature of the present invention, a p-n junction semiconductive device includes a gallium arsenide crystal member with the p-type region being defined by a germanium doped region of the gallium arsenide substrate.

Another feature of the present invention is the same as any one or more of the preceding features wherein the semiconductive device is selected from the class consisting of, a photocathode, an avalanche transist time diode, or a varactor diode.

In another feature of the present invention p-n junction semiconductive devices are grown by successively contacting a gallium arsenide substrate with *p* and *n* doped melts, the p-doped melt being doped with germanium, whereby the p-n junction may be grown in a single thermal cycle of the growth process.

Other features and advantages of the present invention will become apparent upon a perusal of the following specification taken in connection with the accompanying drawings, wherein:

DESCRIPTION OF THE PREFERRED EMBODIMENTS

Figure 1:
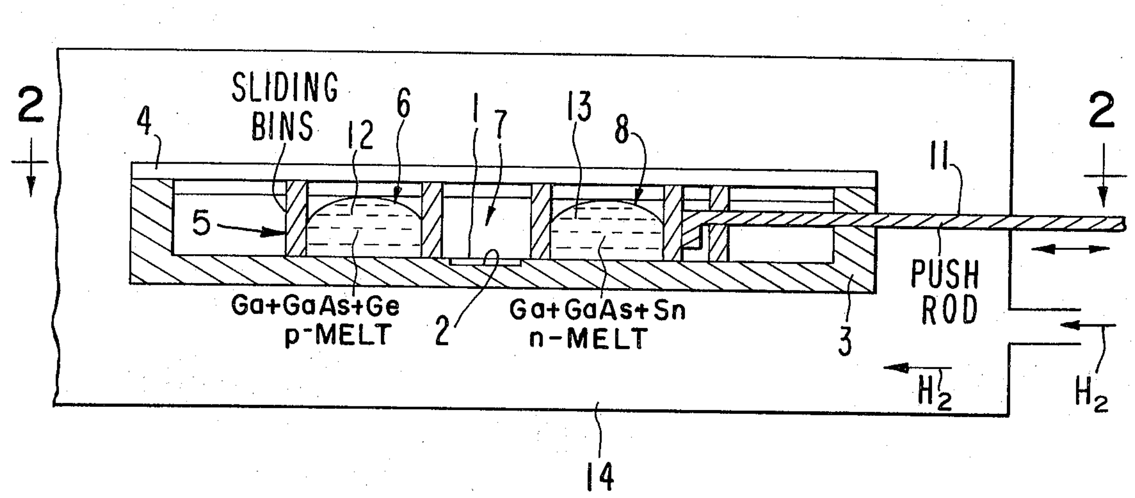
FIG. 1 is a longitudinal sectional view, partly schematic, depicting an apparatus for growing p-n semiconductive junctions in a single thermal cycle.
Figure 2:
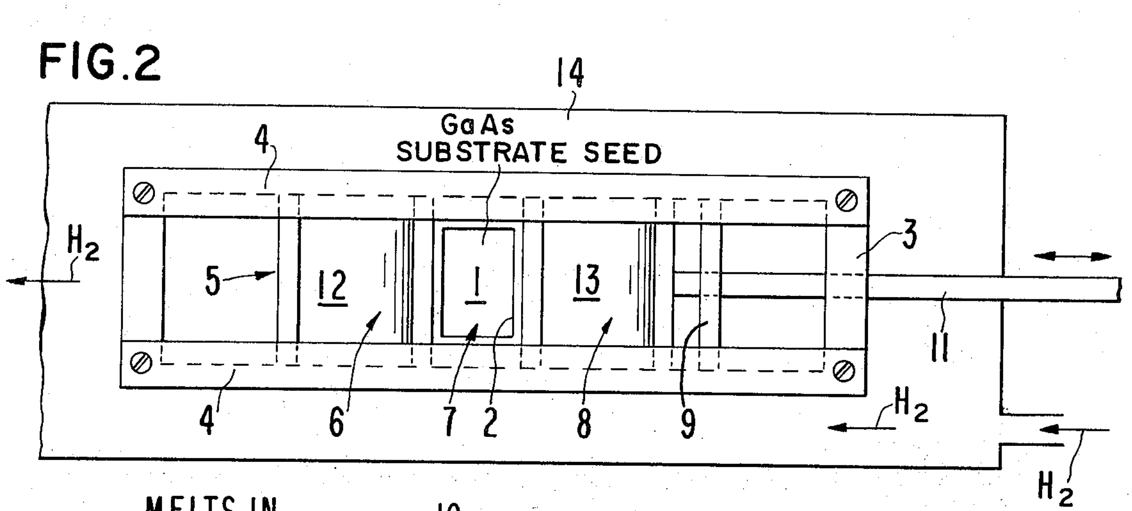
FIG. 2 is a sectional view of the structure of FIG. 1 taken along lines 2—2 in the direction of the arrows.
Figure 3:
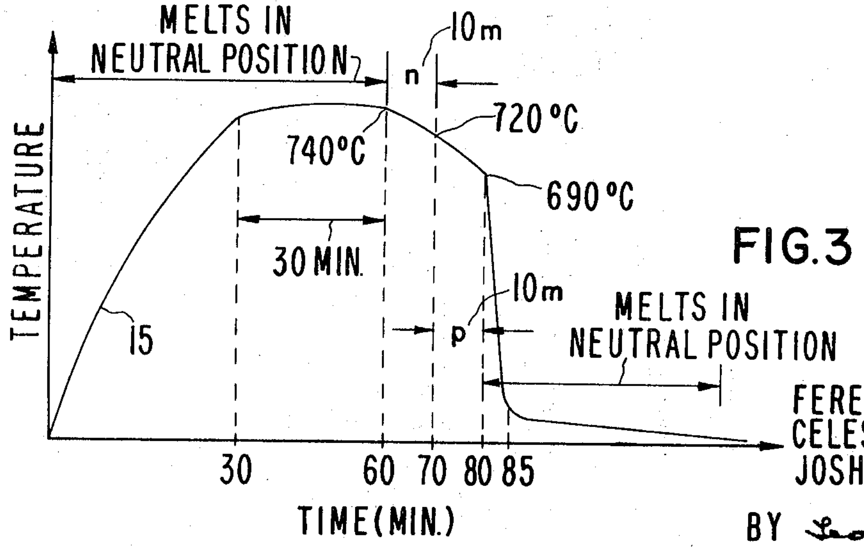
FIG. 3 is a plot of temperature vs. time depicting the thermal cycle utilized for growing the p-n junctions with the apparatus of FIGS. 1 and 2.

Referring now to FIGS. 1–3, there is shown method and apparatus for growing epitaxial p-n junctions in a gallium arsenide substrate 1. More particularly, a wafer-shaped single crystal of gallium arsenide forming the substrate 1 is placed within a recess 2 in the floor of a refractory boat 3. The boat 3 is made of a suitable refractory material, such as quartz, graphite, or Spectrosil (ultra pure quartz). The boat 3 is generally open at the top. A pair of angle shaped guide rails 4 are affixed along the top side edges of the boat 3 such that the flanges of the angle members 4 are parallel to the top and side surfaces of the boat 3.

A generally rectangular slider 5, as of quartz, graphite or Spectrosil is axially slideable within the boat and guided by the guide rails 4. The slider includes a plurality of rectangular compartments 6, 7 and 8 which are open on the top and bottom. A double end wall portion 9 is povided at one end of the slider 5 and is slotted to receive an L-shaped end of a push rod 11, as of quartz, graphite or Spectrosil.

One of the end bins or compartments 6 is charged with material to produce, when melted, a saturated solution of gallium arsenide in gallium doped with germanium. This forms a p-type melt 12 in bin 6. The other end bin 8 is loaded with material to produce, when melted, a saturated solution of gallium arsenide in gallium doped with a suitable donor type dopant such as tin, tellurium or selenium. The boat is positioned within a refactory tube 14, as of quartz, graphite or Spectrosil and the tube is surrounded by an electric furnace, not shown. An inert gas, such as hydrogen, is fed through the tube 14 to provide an inert atmosphere surrounding the charge and substrate 1, as the charge and substrate are elevated to a growth temperature, as indicated by curve 15 of FIG. 3.

Figures 4, 5:
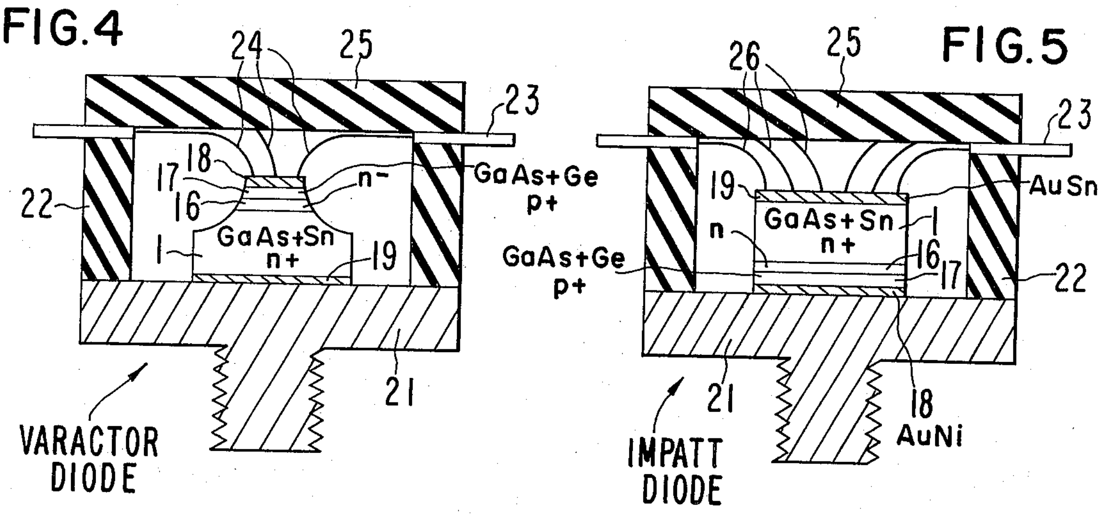
FIG. 4 is a schematic cros-sectional view of a varactor diode incorporating features of the present invention.
FIG. 5 is a schematic cross-sectional view of an IMPATT diode incorporating features of the present invention.

In typical example for fabrication of a varactor diode, as shown in FIG. 4, a single crystal substrate 1 of gallium arsenide doped with a donor type dopant to form an n+-type layer is positioned in recess 2. Such n+-doped gallium arsenide single crystals are commercially available. The wafer or substrate 1 of gallium arsenide would typically have a thickness of 0.010 inch and a resistivity of 0.01 to 0.002 ohm centimeters. Suitable n-type dopants include tin, tellurium or selenium. The crystal is preferably oriented with the (100) face facing into the empty bin 7, i.e., in the neutral position.

The single crystal seed 1 is prepared by slicing and then polishing the sliced surface with borminemethonol. While the slider 5 is in the neutral position, as shown in FIGS. 1 and 2, the boat with its charges and wafer 1 are elevated to a suitable temperature as of 740° C as indicated in the curve 15 of the plot of FIG. 3. The slider 5 is then moved to position the n-melt 13 in bin 8 over the substrate 1. The furnace is then allowed to cool from 740° to 720° C over a minute interval to cause the saturated solution of a n-doped melt 13, to grow an n-doped gallium arsenide layer onto the gallium arsenide seed in the form of an epitaxial layer 16.

In the case of epitaxial growth of n-type gallium arsenide the melt 13 may be composed of 50 grams of 7-nine purity gallium, 50 milligrams of 5-nine purity tin and 3.6 grams of undoped high purity gallium arsenide crystals that are placed in bin 8 and heated to 740° C in the manner as described to obtain a saturated solution of gallium arsenide in gallium.

The n- epitaxial layer 16 of gallium arsenide that is grown by causing the *n* melt to contact the gallium arsenide substrate is generally doped to a level less than $5 \times 10^{16}$ donor atoms per cubic centimeter and has a thickness of between 1 and 10 microns depending inversely on donor concentration. The dopant need not be tin but may comprise tellurium or selenium.

Upon termination of the growth of the *n*- layer 16, the push rod 11, is pulled to move the *p* melt 12 over the gallium arsenide substrate 1. In the process, the slider 5 serves to scrape the excess n-type melt from the surface of the gallium arsenide substrate 1 and to move the *p* melt 12 over the scraped substrate 1. The furnace is then allowed to cool from 720° to 690° C in about a 10 minute interval to produce a growth of an epitaxial germanium doped p-type layer 17 of gallium arsenide on the n-layer 16 to produce a p-n junction at the interface of the two epitaxial layers 16 and 17.

The germanium doped gallium arsenide layer perferably has a germanium concentration between 0.5 and $2 \times 10^{19}$ atoms per cubic centimeter and certainly more than $10^{14}$ germanium atoms to the cubic centimeter. After the boat has cooled to 690° C, the slider 5 is moved to the neutral position, as shown in FIGS. 1 and 2, thereby scraping the excess p-type melt material from the substrate 1. The boat and the substrate is then allowed to rapidly cool from 690° C to room temperature.

The thickness of the p+ layer 17 is generally between 1 and 6 microns and preferably 2 microns. Ohmic contacts 18 and 19 shown in FIG. 4 then formed over the opposite sides of the wafer by evaporating a suitable material such as a gold-germanium alloy to a thickness of 1,000 A. This coating is then covered with a layer of gold to a depth of approximately 1 micron.

The wafer is then thinned, etched, and diced to form individual mesa configuration varactor diodes as shown in FIG. 4. The individual varactor diode is then mounted to a stud 21 as of copper by ultrasonic bonding. The stud 21 serves as a heat sink and includes a ceramic cylinder 22 hermetically sealed to the stud 21 about the periphery thereof. An annular electrode structure 23 is bonded to the upper edge of the ceramic insulator 22 and a plurality of wire leads 24 interconnect the top layer 18 of the varactor diode to the electrode 23. A ceramic cap 25 is hermatically sealed over the top of the electrode 23 and insulator 22 to form a hermetically sealed package.

Varactor diodes similar to that of FIG. 4 have hertofore been grown or fabricated utilizing zinc as the p-type dopant in the *p* melt 12. The problem with using zinc as the p-type dopant is that it has a vapor pressure at 700° C of approximately 60 torr.

Therefore, the zinc doped p-melt 12 could not be contained in the same slider or boat with the n-type melt 13, as the zinc would contaminate the *n* melt 13. Therefore, in the prior art, the *p* layer had to be grown in a separate thermal cycle from that employed for growing the *n* layer. Subjecting the semiconductive device to two thermal cycles, during the growth process, makes control of the thickness of the layers and the concentration of the dopants more difficult as the dopants have a tendency to diffuse out of the layers into adjacent zones at elevated temperatures.

Also, quality control of the concentration of the zinc acceptor atoms in the grown layer is made extremely difficult because the zinc atoms are diffusing out of the melt reducing the concentration of zinc in the melt with time. Thus, a new melt must be produced to each growth cycle in order to produce reproducible results.

Thus, the advantage of using germanium as p-type dopant is that it is easier to control the concentration of the *p* dopant in the *p*+ layer, it is easier to control the thickness of layers, and more abrupt junctions are obtained between adjacent layers. The ability to obtain a more abrupt junction increases the breakdown voltage of the resultant p-n junction device. For example, similar varactor diodes, one grown with a zinc doped p+ layer and one grown with a germanium doped *p*+ layer were compared and the germanium doped varactor diode was found to have an average breakdown voltage of 44 volts, whereas the average zinc doped varactor diode has a breakdown voltage of only 37 volts.

Referring now to FIG. 5 there is shown an improved avalanche transit time (IMPATT) diode incorporating features of the present invention and constructed according to the method described above with regard to FIGS. 1–4. More particularly, the IMPATT diode of FIG. 5 is essentially identical to the varactor diode of FIG. 4 with the exception that the diode is inverted and is not etched to obtain the mesa configuration, but is merely scribed and diced to provide planar electrodes on opposite sides. The resultant die is mounted with the $p+$ layer down by ultrasonically bonding electrode 18 to the stud 21. Ribbon leads 26, as of 5 mils by 0.5 mil gold, are bonded to the upper electrode 19 by ultrasonic welding. The outer ends of the ribbon leads 26 are bonded, as by soldering, to the electrode structure 23.

The advantage of the IMPATT diode of FIG. 5, as contrasted with the prior rt, which employed zinc as the p-type dopant for the $p+$ layer, is that a more uniform and abrupt junction is obtained between the $n$ and $p$ layers. In addition, the low diffusion coefficient for germanium allows the junction to operate at a temperature of approximately 300° C without substantial diffusion of the p-type germanium dopant. In the prior art, at the junction temperature of 300° C, substantial diffusion of the zinc dopant was obtained, thereby decreasing the life and reliability of the prior art device as contrasted with use of germanium as the p-type dopant.

Figure 6:
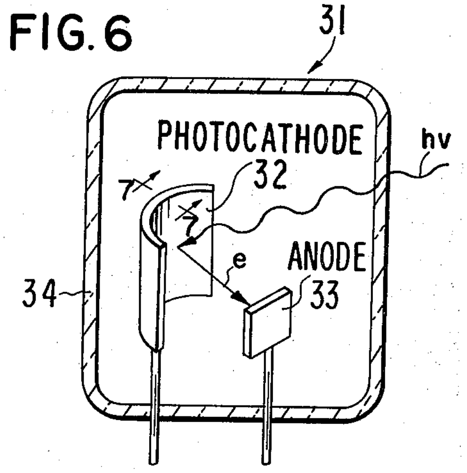
FIG. 6 is a schematic perspective sectional view of a photodetector incorporating a photocathode of the present invention.
Figure 7:
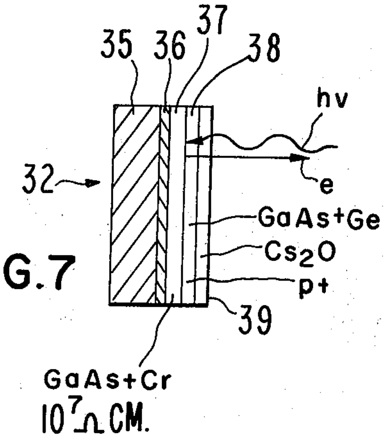
FIG. 7 is an enlarged fragmentary sectional view of a portion of the structure of FIG. 6 taken along lines 7—7 in the direction of the arrows.

Referring now to FIGS. 6 and 7, there is shown a photodetector 31 incorporating an improved photocathode 32 employing features of the present invention. More particularly, the photodetector 31 includes a photocathode electrode 32 spaced from an anode electrode 33 in a transparent evacuated envelope structure 34. The photocathode 32 includes a metallic substrate member 35, as of molybdenum bonded to a metallic contact 36, as of gold, nickel or gold-tin alloy, deposited, as by evaporation on the back side of a single crystal of gallium arsenide 37 doped with chromium to provide a semi-insulating substrate 37 having a resistivity as of $10^7$ ohm centimeters. A $p+$ layer of germanium doped gallium arsenide 38 is epitaxially grown on the chromium doped gallium arsenide substrate 37 in the manner as previously described above with regard to FIGS. 1–3 but omitting the steps of the above cited method employed for growing the n-type layer. The germanium doped gallium arsenide epitaxial layer 38 is grown to a thickness of between 1 and 2 microns with a carrier concentration greater $5 \times 10^{17}$ per cubic centimeter. The $p+$ layer 38 is then coated with a monoatomic layer 39 of Cs and oxidized to provide a low work function $Cs_2O$ electron emission surface.

In operation, photons pass through the envelope 34 and strike the photocathode 32. They pass through the low work function layer into the germanium doped gallium arsenide layer 38 wherein they are absorbed to liberate electrons which pass through the photocathode layer 38 under the influence of an applied potential between cathode 32 and anode 33 are emitted into the vacuum and flow to the anode 33.

Figure 8:
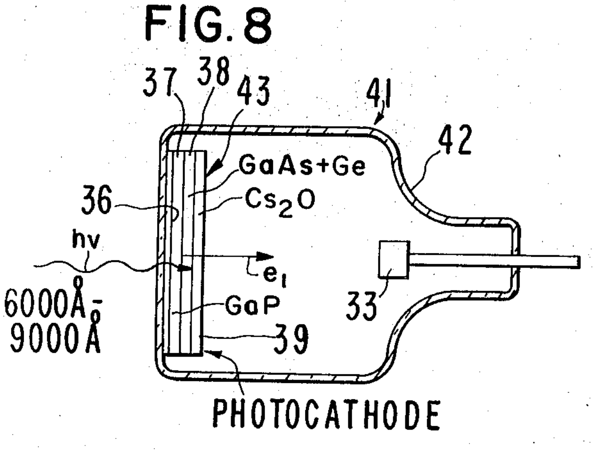
FIG. 8 is a schematic longitudinal sectional view of an alternative photodetector incorporating a photocathode of the present invention.
Figure 9:
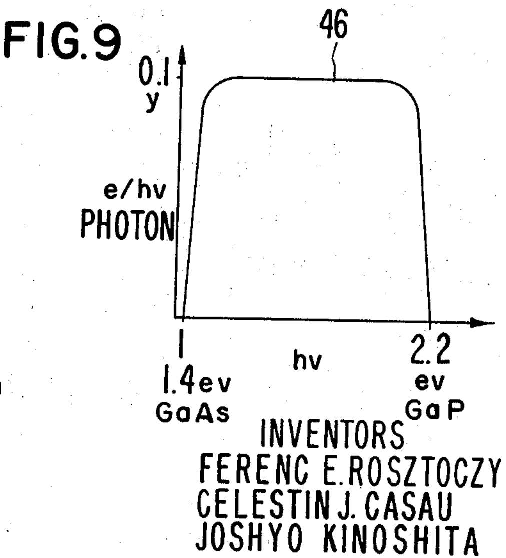
FIG. 9 is a plot of electron yield per incident photon vs. energy of the incident photon in electron volts and depicting the performance of the photodetector of FIG. 8.

Referring now to FIGS. 8 and 9, there is shown an alternative photodetector 41 incorporating features of the present invention. The photodetector 41 includes an evacuated envelope 42 having a photocathode 43 mounted to a transparent face of the envelope 42. The photocathode 43 is similar in cross-section to the cross-section of FIG. 7 with the exception that electrode 35 is replaced by the envelope 42 and the conductive layer 36 is formed by a optically transparent deposit of tin oxide.

The single crystal substrate 37 is gallium phosphide instead of gallium arsenide, such gallium phosphide being doped with a suitable dopant such as chromium to provide a semi-insulating resistivity of approximately $10^7$ ohm centimeters. The $p+$ layer 38 is grown on the gallium phosphide crystal in the manner as previously described and the $p+$ layer is coated with a monoatomic layer of cesium and oxidized to form $Cs_2O$ as described with regard to FIG. 7.

An anode electrode 33 is located in the envelope. Light to be detected and falling within the wave length of 6,000 A to 9,000A passes through the transparent envelope 42 and through the gallium phosphide layer 37 into the germanium doped gallium arsenide $p+$ layer 38. Within the gallium arsenide layer 38 the photons are absorbed and electrons are liberated which diffuse through the gallium arsenide photoconductive layer and are emitted out of the low work function surface to the anode 33.

The photodetector 41 has an output as characterized by curve 46 of FIG. 9 wherein the electron yield is approximately 0.1 electrons per photon of energy between the band gaps of gallium arsenide and gallium phosphide as indicated in FIG. 9. An electrical potential is applied between the transparent electrode 36 and the anode 33 to provide the electric field for focusing the photoelectrons emitted from the photocathode to the anode 33.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

We claim:

1. A method of making a germanium doped multilayered GaAs semiconductor device in a single thermal step, comprising the steps of:
   - providing a GaAs crystal substrate;
   - providing a plurality of separate charges of GaAs substances proximate the substrate and containing n type dopant and p type germanium dopant;
   - heating the substrate and charge substances causing the charge substances to melt forming n doped and p doped melts;
   - alternately contacting the substrate to the $n$ doped and $p$ doped melts while simultaneously lowering the temperature thereof to form a multilayered pn junction device over the substrate, having an $n$ type dopant concentration of less than $5 \times 10^{16}$ atoms per cc, the low vapor pressure of germanium preventing vapor contamination of the n melt with p germanium dopant; and
   - lowering the temperature of the substrate to room temperature.

2. The method of claim 1 wherein the substrate and charge material are raised to a temperature of about 740° C, before exposing the substrate to the charge melt.

3. The method of claim 1 wherein the GaAs substrate is doped with n type material, and is first exposed to the n type charge melt and then exposed to the p type charge melt containing the germanium p type dopant, causing the resulting device to have the p doped layer outer most and the n doped layer intermediate between the substrate and the p doped layer.

* * * * *